United States Patent [19]

Venis, Jr.

[11] 4,168,986

[45] Sep. 25, 1979

[54] METHOD FOR PREPARING LAMELLAR PIGMENTS

[75] Inventor: Joseph J. Venis, Jr., Hanson, Mass.

[73] Assignee: Polaroid Corporation, Cambridge, Mass.

[21] Appl. No.: 921,187

[22] Filed: Jul. 3, 1978

[51] Int. Cl.² ............................................. C04B 31/02
[52] U.S. Cl. .................................. 106/291; 106/299; 106/300
[58] Field of Search ................. 106/291, 309, 300, 299

[56] References Cited

U.S. PATENT DOCUMENTS

| | | | |
|---|---|---|---|
| 2,713,004 | 7/1955 | Greenstein | 106/193 |
| 3,008,844 | 11/1961 | Grunin et al. | 106/193 |
| 3,087,828 | 4/1963 | Linton | 106/291 |
| 3,123,489 | 3/1964 | Bolomey et al. | 106/291 |
| 3,123,490 | 3/1964 | Bolomey et al. | 106/291 |
| 3,374,105 | 3/1965 | Bolomey | 106/291 |

OTHER PUBLICATIONS

"Nacreous Pigments", W. M. Greenstein, Encyclopedia of Polymer Science and Technology, (1969) 10, pp. 193-211.

*Primary Examiner*—Helen M. McCarthy
*Attorney, Agent, or Firm*—Louis G. Xiarhos

[57] ABSTRACT

A method for the production of lamellar pigments by a vacuum deposition process is described. The method involves the deposition of a thin layer of sodium fluoride release-substrate material upon a suitable condensing surface, e.g., a moving polyester web, and the deposition thereon of a thin film of lamellar pigment-producing material. The resulting lamellar pigment material is removed from the condensing surface by dissolving the sodium fluoride release substrate material in a substance, e.g., water, which is a nonsolvent for the lamellar pigment material. The material is fragmented into lamellar pigment particles for utilization in a number of applications where the light-reflective properties of such pigment materials are desired. The utilization of a sodium fluoride release layer permits more efficient control of the rate of deposition of the desired release layer and provides lamellar pigments of desirable specular reflectivity.

19 Claims, No Drawings

METHOD FOR PREPARING LAMELLAR PIGMENTS

BACKGROUND OF THE INVENTION

This invention relates to a method for preparing lamellar pigment materials by vacuum deposition and to lamellar pigment materials prepared by such methods. More particularly, it relates to an improved method whereby processing efficiencies and lamellar pigment materials of improved specular reflectivity are obtained.

The production of lamellar pigment materials by vacuum deposition techniques has been known and is described, for example, in U.S. Pat. Nos. 2,713,004 (issued July 12, 1955 to L. M. Greenstein); 3,123,489 (issued Mar. 3, 1964 to R. A. Bolomey et al); and in British Patent Specification No. 992,805 (published May 19, 1965). In general, such methods have been utilized in the production of nacreous pigments of lamellar or platelet shape exhibiting characteristic pearlescent or interference effects. Such pigment materials, because of their lamellar particle shape and high index of refraction, have found application in transparent substances of different index of refraction, such as plastics, as efficient reflectors of light from their platelet surfaces.

The production of lamellar pigment materials from high index of refraction substances such as zinc oxide, zinc sulfide, titanium dioxide, zirconium oxide and lead chloride by vacuum deposition has been described, for example, in the aforesaid U.S. Pat. No. 3,123,489. In general, the production of such lamellar pigment materials has involved the deposition of a suitable release-substrate material onto a surface, such as a rotating disc or endless belt, and the deposition thereon of the lamellar pigment-producing material. Typically, the lamellar pigment material has been removed by dissolving the release layer with a material which is a solvent for the release layer but a non-solvent for the lamellar pigment material.

Among the substances which have been reported as effective release-layer materials is sodium chloride. Sodium chloride, in part because of its ready availability, solubility in water and relative inertness to a variety of useful pigment-producing materials, has found special application as a release layer in the formation of lamellar pigment materials. The utilization of sodium chloride for such purposes is, however, attended by certain disadvantages. For example, sodium chloride, when evaporated with the aid of an electron beam, exhibits undesirable heat sensitivity which results in poor rate control and, therefore, deposition of a non-uniform coating of sodium chloride on the deposition surface. The deposition of a non-uniform layer of release coating leads to difficulty in the removal of desired pigment material by washing as the result of the deposition of pigment over areas where the sodium chloride layer is thin. The non-uniform deposition of the sodium chloride layer and consequent difficulties in removal of desired pigment material result in reduced yield of pigment material and re-use of a depositing surface, such as a Mylar web, is effectively negated.

The utilization of a source or charge of sodium chloride in the hearth of an electron beam gun in a vacuum deposition chamber is observed, in addition, to present a problem of cavitation or "tunneling". This is largely the result of the impinging of electrons of highest energy and in greatest number upon the center of the hearth containing the sodium chloride charge and this detracts from the uniform coating of the sodium chloride upon the deposition surface. The density of sodium chloride also imposes a limitation upon the conduct of extended deposition runs. A hearth utilized in vacuum deposition methods will generally be of fixed volume or capacity and density of the charge material will determine the weight of material which may be accomodated by the hearth. During extended runs, the sodium chloride charge tends to be rapidly exhausted.

Depending upon the nature of the substance utilized for the formation of a release layer, the physical properties of the resulting lamellar pigment material may also be effected. High specular reflectivity, for example, may be especially desired in some applications and the utilization of a release-layer material effective to provide such reflectivity in lamellar pigment materials will be especially advantageous.

Accordingly, it is an object of the invention to provide a process for preparing lamellar light-reflective pigment materials.

Another object of the invention is to provide a vacuum deposition process for the production of such pigment materials utilizing a substance which can be efficiently and effectively deposited as a release layer for the formation of such pigment material.

Still another object of the present invention is to provide a vacuum deposition process utilizing a substance which can be uniformly coated upon a deposition surface as a release layer for the formation of lamellar pigment material and which can be readily removed from the deposition surface by dissolution in a liquid which is a non-solvent for the lamellar pigment material.

Another object of the invention is to provide such a process effective to provide lamellar pigment material exhibiting improved specular reflectivity.

Other objects will become apparent from the description appearing hereinafter.

SUMMARY OF THE INVENTION

These and other objects can be achieved by the present invention which resides in a method for preparing lamellar pigments whereby certain processing advantages and pigment materials of improved specular reflectivity are realized. The present invention is based in part upon the discovery that sodium fluoride can be effectively employed as a release-substrate material in a vacuum deposition process for the manufacture of lamellar pigment materials. Such a process involves the steps of first depositing under vacuum a thin layer of the release-substrate material onto a depositing surface and, thereafter, depositing under vacuum onto the release-substrate layer at least one layer of a lamellar pigment-producing material; dissolving the release-substrate layer in a liquid which is a solvent for the release-substrate layer and a non-solvent for the lamellar pigment material, thereby to remove the lamellar pigment material from the depositing surface; and fragmenting the lamellar pigment material to a particulate state. It has been discovered that the utilization in such method of sodium fluoride as the release-substrate material and as the release layer for the formation of lamellar pigments permits the realization of certain advantages, including efficient control of the rate of sodium fluoride film formation, uniformity in the formation of the desired sodium fluoride release layer, reduced cavitation of the sodium fluoride charge during the vacuum deposition process and more efficient utilization of the sodium fluoride charge material for the conduct of extended runs. In addition, it has been discovered that the employment of a sodium fluoride release layer permits the manufacture of lamellar pigments of improved specular reflectivity.

Various objects, details, constructions, operations, uses, advantages and modifications of the invention will be apparent from the following description.

DETAILED DESCRIPTION OF THE INVENTION

As has been pointed out hereinbefore, the present invention resides in an improved vacuum deposition method for preparing lamellar pigments whereby processing efficiencies and lamellar pigment materials of improved specular reflectivity are obtained. Methods of preparing pigments by vacuum deposition are known and described in the hereinbefore-mentioned U.S. Pat. No. 3,123,489. Other techniques and apparatus can, however, be utilized in accordance with known teachings for the provision of lamellar pigment materials. In general, lamellar pigments can be prepared in accordance with the present invention by resort to vacuum sublimation or evaporation techniques utilizing a conventional vacuum chamber and a deposition surface, such as a polyester web, for the deposition of a sodium fluoride release layer and a pigment-producing material thereon.

Typically, the sodium fluoride release layer-providing material and the lamellar pigment-producing material will be placed into a confined and evacuated space for coating onto a depositing surface. A conventional vacuum chamber can be utilized for this purpose. The respective sodium fluoride and lamellar pigment-producing materials will be placed into suitable hearths and heated so as to effect evaporation or sublimation thereof and coating onto the deposition surface. A shield, such as a nickel-plated iron plate can be disposed between the respective hearths so as to divide the vacuum chamber into separate coating areas, to prevent intermixing of vapors and to prevent electromagnetic interference from the physical placement of separate sources within close proximity.

The energy utilized in connection with the vaporization or sublimation of the sodium fluoride release coat and lamellar pigment-producing materials from their respective hearths can be supplied from known sources. Thus, the respective hearths can be heated by conventional resistance heating elements. Preferably, the sodium fluoride and lamellar pigment-producing materials are sublimed by resort to an electron beam source. The utilization of an electron beam to effect vaporization or sublimation provides considerable latitude in the nature of the lamellar pigment-producing materials that can be vaporized from the hearth. Such electron beam sources are known and, in general, comprise a heated filament and magnetic means for deflecting emitted electrons onto the charge of sodium fluoride or lamellar pigment-producing material. Electron beam guns adapted to deflect an electron beam at an angle of about 270 degrees into each of the respective hearths containing the sodium fluoride and lamellar pigment-producing charges can be effectively utilized.

The sodium fluoride and lamellar pigment-producing materials can be evaporated in separate vacuum chambers for coating onto a suitable deposition surface. It will be preferred, however, from the standpoints of equipment costs and ease of operation, to provide hearths for such materials within a single vacuum chamber and to simultaneously heat such materials to provide the desired vaporization of the sodium fluoride and lamellar pigment-producing materials. It will be appreciated that, depending upon the particular nature of the lamellar pigment-producing material employed, different amounts of energy will be employed to effect desired vaporization. Shields or shutters positioned over the respective hearths and capable of being manipulated from outside the vacuum chamber can be utilized to prevent premature deposition of the respective charge materials onto the deposition surface. Thus, the protective shields or shutters can be removed upon attainment of steady states of evaporation and coating of the sodium fluoride and lamellar pigment-producing materials onto the deposition surface can be accomplished.

The conduct of a method for preparing lamellar pigment materials utilizing a removable release layer involves the steps of first depositing a thin film of the release-layer material, i.e., sodium fluoride, onto the depositing surface and, thereafter, depositing onto the sodium fluoride a thin film of the lamellar pigment-producing material. This can be readily accomplished by employing a deposition surface which comprises a moveable plate or endless belt which is caused to move firstly over the source of release layer-providing material, i.e., sodium fluoride and, then, over the source of the lamellar pigment-producing material. Especially useful for this purpose is a moving web, preferably having a smooth surface, and composed of a material which is inert to the sodium fluoride release coating to be deposited thereon. A web of cellulose acetate, cellulose, polyfluorocarbon, polyethylene or polyester, e.g., Mylar, can be employed. The surface of the belt may be modified, if desired, by metalizing, e.g., coating with aluminum or other metal by evaporation.

In actual practice, the depositing surface provided by an endless belt or web can, for example, be caused to pass in one direction over a vaporized charge of sodium fluoride and over a vaporized source of the lamellar pigment-producing material for deposition of such material as a thin film onto the thin film of sodium fluoride. The so-treated web can, if desired, be then passed over a charge of sodium fluoride or a charge of the same or different lamellar pigment-producing material. Thus, alternating layers of sodium fluoride and lamellar pigment-producing materials can be deposited onto the web or multiple layers of lamellar pigment-producing materials, usually dissimilar materials, can be deposited onto the sodium fluoride release layer for the provision of a multilayer lamellar pigment.

A preferred practice of the invention involves the utilization of multiple hearths in each section of the vacuum chamber. Thus, each multiple hearth, equipped with a plurality of cavities rotatable in turret-like fashion, can be utilized for the application in predetermined manner of a variety of release-layer and lamellar pigment-producing materials. For example, a web can be passed in one direction over vaporized sodium fluoride and, thence, over a source of a vaporized lamellar pigment-producing material. The multiple hearth containing the pigment-producing material can be rotated to move a source of sodium fluoride into the path of the electron beam and the first multiple hearth can be rotated to place a source of the same or different lamellar pigment-producing substance into the path of the electron beam. In this manner, and by passing the web for a return pass, alternate layers of pigment-producing material and sodium fluoride can be deposited onto the web. While the present invention is described with particular reference to the employment of a web or endless belt, other moving depositing surfaces can be utilized. Thus, for example, a rotating disc can be employed for the provision of alternating layers of sodium fluoride and pigment-producing material. Such alternate layers can be deposited such that many layers of pigment-producing material are deposited upon a corresponding number of sodium fluoride release layers.

The thickness of the sodium fluoride release layer coated onto the depositing surface is not critical per se. The layer should, however, be applied in a uniform manner inasmuch as the uniformity of such layer will affect the ease of removal of lamellar pigment material from the depositing surface and may affect the specular quality of such pigment material. Thus, the application of a non-uniform layer of sodium fluoride may cause the lamellar pigment material to adhere tenaciously to the depositing surface and render effective recovery of the lamellar pigment material only difficultly attainable. Damage caused to the depositing surface as the result of attempts to remove adherent pigment material may effectively negate re-use of the depositing surface, thus, reducing economic efficiency. The deposition of a uniform layer of sodium fluoride capable of removal from the depositing surface without damage to such surface can be readily accomplished by employment of the process of the invention. Good results are achieved, for example, by depositing a release layer having a thickness of from about 200 to about 600 Angstroms.

The thickness of the film of lamellar pigment-producing material coated onto the sodium fluoride release layer will vary depending upon the desired optical characteristics of the pigment material and the intended uses thereof. The properties of such pigment materials are derived from the shape and index of refraction of the pigment particles. These particles are in the form of platelets and in use will be generally oriented parallel to one another in, for example, a medium or continuum having an index of refraction different from that of the index of refraction of the pigment material. The pigments are thin, have flat parallel surfaces, permit transmission of light therethrough and reflect light at their flat surfaces. Conventional transparent substances in which such pigment materials will usually be employed for utilization of their light-reflective properties will have indices of refraction in the range of about 1.4 to 1.6. Such substances include cellulose acetate, cellulose nitrate, hydroxyethyl cellulose, carboxymethyl hydroxyethyl cellulose and the like, polyvinyl alcohol, polyester resins, polyacrylic resins, epoxy resins, polyethylene, polypropylene, phenylformaldehyde resins and amineformaldehyde resins.

An index of refraction different from the incorporating transparent continuous phase material assures the reflection of light from the platelet surfaces. The optical properties of such pigment materials can vary depending upon thickness and index of refraction. Thus, pigment materials having a whitish or silvery appearance can be prepared utilizing the method of the present invention. Similarly, pigment materials exhibiting color by reflected light and the complementary color by transmitted light can be prepared.

Preferred lamellar pigment materials prepared by the present invention include those materials useful for the provision of a substantially white background for the viewing of a photographic image. Lamellar pigment materials suited for this purpose and the utilization thereof in photographic applications, including diffusion transfer photographic products and processes, are described in detail in the U.S. Patent Application of Ruth C. Bilofsky and Howard G. Rogers, Ser. No. 744,598, filed Nov. 24, 1976 for Novel Photographic Products and Processes; and in the continuation-in-part application thereof, Ser. No. 921,186, filed of even date. The lamellar pigments described in detail therein comprise flat, plate-like, transparent or slightly translucent, white light-reflecting single or multi-layer pigments. These pigments can be broadly defined as having at least one layer having a geometric thickness within the following expression: $T=(\lambda/4)/n$ (or an odd multiple thereof), where T is the geometric (or physical) thickness, $\lambda$ represents a wavelength or wavelength range of radiation in the visible region of the spectrum, and n represents the refractive index of the layer material and is at least 1.7. While such pigment materials constitute preferred pigments from the standpoint of their particularly useful application in certain photographic products and processes, it will be appreciated that other lamellar pigment materials can be prepared utilizing the method of the present invention.

The method of the present invention can be utilized to provide pigment materials from high index of refraction substances which cannot ordinarily be crystallized in the form of platelets. Among the substances of high index of refraction which can be made into lamellar pigments by the method of the present invention are zinc oxide, zinc sulfide, quanine as made synthetically, zirconium dioxide, titanium dioxide and lead chloride. Preferred pigment materials prepared by the method of the present invention include titanium dioxide and zirconium dioxide.

In accordance with the present invention, lamellar pigment materials comprised of a plurality of adhering, light-transmitting layers of pigment material having different indices of refraction, i.e., multi-layer pigments, can be prepared. In such multi-layer pigments, the adjacent layers have different refractive indices such that, in use when light falls on the multi-layer pigment, light is reflected at the surfaces of the multiple layers to provide interference effects by virtue of the refractive index and thickness of each platelet.

In the case of preferred multi-layer pigments, any layer next adjacent a layer of the above specifications will be of a different layer material but will have a geometric thickness within the above expression. In other words, adjacent layers of such preferred multi-layer pigments have different refractive indices and can have the same but usually have different geometric thicknesses within the above expression.

Preferred individual, single-layer lamellar pigments are highly efficient white light-reflective pigments having a pair of substantially parallel reflective surfaces and a geometric thickness (T) between the surfaces within the expression:

$T=(\lambda/4)/n$ (or an odd multiple thereof), where, as already mentioned, $\lambda$ is a wavelength or wavelength range of radiation within the visible region and n represents the refractive index of the layer material and is at least 1.7.

The expression "$\lambda$"/4 is referred to here as the "optical thickness" of the single layer pigment. The preferred single layer pigments are those having an optical thickness which will provide maximum reflection efficiency for radiation of a wavelength or wavelength range in the visible region of the spectrum (particularly from about 4500 Å to about 6500 Å). Accordingly, such single layer pigments have an optical thickness between about 1125 Å (4500 Å/4) and about 1625 Å (6500 Å/4). Especially preferred are those single layer pigments having an optical thickness between about 1250 Å to about 1375 Å so that the pigment will provide maximum reflection efficiency for radiation in or near the mid-visible region of the spectrum (from about 5000 Å to about 5500 Å).

The preferred single layer lamellar pigments prepared by the method hereof are prepared using materials having a refractive index above 1.7. Particularly preferred single layer lamellar pigment-producing materials are those having refractive indices between about 2.0 to about 2.8. Accordingly, the corresponding geometric thicknesses for single layer pigments prepared from these particularly preferred materials are within the range of from about 450 Å to about 700 Å. Although single layer lamellar pigments having geometric thicknesses between about 450 Å to about 700 Å are particularly preferred in certain photographic applications, it should be understood that the method of the present invention has applicability to the formation of other pigment materials of varying geometric thickness.

Materials particularly suitable for preparing single layer lamellar pigments of the present invention are metal oxides and metal salts having a refractive index of at least about 1.7 and preferably between 2.0 to about 2.8 or slightly higher. Especially preferred materials are those metal oxides and metal salts having the above refractive index which are stable and substantially insoluble in aqueous alkali. Particularly preferred materials are zirconium oxides or titanium oxides.

Preferred multi-layer pigments prepared by the method of this invention comprise at least one and preferably more than one layer having the specifications described above for the single layer pigment. The layer next adjacent a layer of the above described specifications is of a different material but has a geometric thickness within the expression described before. In other words, such multi-layer pigments hve one layer with a refractive index above 1.7 with the next adjacent layer having a different and preferably a lower refractive index.

Particularly preferred multi-layer pigments are those having an odd number of layers with high refractive index layers (at least 1.7) separated by adjacent layers having a refractive index at least about 0.3 lower than the high refractive index layers. Particularly efficient multi-layer pigments prepared by the method of the invention are those comprised of high refractive index layers having an index of refraction above about 2.0 and next adjacent layers having an index of refraction of about 1.5 or less.

An example of a two-layer lamellar pigment prepared by the method of the present invention is a composite of one high refractive index substance and a substance of low refractive index, such as the combination ZnS—$MgF_2$ or $TiO_2$—$MgF_2$. A three-layer system may have a high-low-high on low-high-low configuration, e.g., $TiO_2$—$MgF_2$—$TiO_2$ or $MgF_2$—$TiO_2$—$MgF_2$, respectively, the former having an advantage when the multi-layer pigment is used in a supporting medium having an index of refraction of approximately 1.5. A preferred five-layer multi-layer pigment has a high-low-high-low-high configuration where the low index materials have an index of about 1.5 or less and the high index materials have an index of at least 1.7.

The conditions utilized in the process of the present invention for the deposition of sodium fluoride and lamellar pigment-producing materials in vacuum will vary depending upon the nature of the particular materials being deposited and their physical properties and upon the desired thickness of the single or multiple layers of pigment-producing material coated onto the depositing surface. It will be apparent from the foregoing that the quantity of heat supplied to the pigment-producing material and to the sodium fluoride substrate-providing material will be such as to produce the desired film thicknesses with the belt, disc or other device positioned in the evacuated space in a stationary manner or moving at a particular velocity. The rate of heating will be determined by the specific geometry of the assembly as well as by the rate of motion and the desired film thickness. Digital deposition monitors and controller can be suitably utilized so as to monitor and control the desired rate of deposition.

The temperatures employed will depend upon the temperature at which the particular lamellar pigment-producing material or sodium fluoride substrate material evaporates, which typically would be about 1850° C. for $TiO_2$, 1200° C. for $MgF_2$ and 1100° C. for NaF. The conditions of vacuum utilized in the vacuum deposition and method of the invention will also depend upon the nature of the particular materials employed. Good results can be obtained utilizing a vacuum pressure in the range of from about $5 \times 10^{-6}$ to about $5 \times 10^{-5}$ mm.Hg.

The lamellar pigment material, whether a single substance platelet or a multi-layer lamellar pigment, is recovered from the depositing surface by contacting the deposited surface with a liquid which is a solvent for the sodium fluoride release layer but a non-solvent for the lamellar pigment material. Typically, this will involve cooling of the evacuated space, breaking of the vacuum and washing of the depositing surface with such a liquid, such as water. The water solubility of sodium fluoride is such that the lamellar pigment material is caused to be removed from the depositing surface in the form of small flakes.

The dimensions of the resulting lamellar pigment particles can be controlled in known manner by mechanical fragmentation of the flaked particles which are obtained by dissolving away the sodium fluoride release layer. For nacreous or color effects which appear continuous to the eye, the flakes should be smaller than can generally be seen individually, but must be large enough to maintain a suitable ratio of length to thickness. The suspension or slurry of pigment flakes in liquid can be reduced to the desired platelet size by conventional milling, sonification or other size-reducing tecnhiques. A size range of from 1 to 50 microns is suitable for most purposes. Larger flakes may be used for special purposes. These will be visible as discrete flakes which have uniform color by reflected light. Platelets of different dimensions may be separated by conventional classifying and sorting techniques, for example, as by resort to known elutriation methods.

The lamellar pigment materials removed from the depositing surface by the washing of the sodium fluoride release layer can be kept in a liquid vehicle for convenient use or can be dried to the desired lamellar pigment material. The pigment material can be washed with organic or other solvents to reduce the tendency of individual platelets from adhering to one another. An aqueous slurry of lamellar pigment material can be used directly in latex systems or can be contacted in known manner with a water-miscible solvent for transfer of the pigment into an organic vehicle. Suitable techniques for incorporating such pigment materials into an organic vehicle or supporting medium are known and described, for example, in the aforesaid U.S. Pat. No. 3,123,489. The lamellar pigment materials prepared by the method of the present invention can be calcined after drying of the pigment material. This operation can be effectively accomplished by heating the dried pigment material in air at a temperature ranging from 500° to 1000° C. from 1 to about 4 hours. This calcining step, particularly in the case of lamellar pigments of titanium dioxide, effects conversion of suboxides formed during the deposition process to the desired crystalline form of the pigment material. As a consequence, the index of refraction of the lamellar pigment material is increased.

The present invention will be more completely understood by reference to the following illustrative but non-limitative Examples.

EXAMPLE I

This EXAMPLE describes a method for the production of a single-layer lamellar titanium dioxide pigment.

A polyester substrate (4 mil. Mylar web) was conducted through a vacuum chamber divided into two separate coating areas each equipped with a hearth accomodating approximately 30 cc. of the material to be deposited onto the substrate and an electron beam gun for the provision of a source of energy (270° bent beam) for vaporization of the depositing substance. In each coating area, rate of deposition was monitored and controlled with the aid of quartz crystal sensor heads and digital deposition controllers and was adjusted to steady state prior to opening of a shutter placed over each hearth. The moving substrate was placed approximately 10.5 inches above the hearths. The vacuum chamber was sealed and evacuated and pressure was maintained between about $5 \times 10^{-6}$ and $5 \times 10^{-5}$ mm. of mercury during the vapor deposition operations.

In the first coating area, a release layer of sodium fluoride was deposited onto the moving polyester substrate by vapor deposition. The rate of deposition of sodium fluoride onto the Mylar substrate was controlled by the rate of evaporation and the speed of the moving substrate to provide a layer of sodium fluoride about 575 Å geometric thickness.

In the second coating area, titanium dioxide was evaporated and deposited onto the sodium fluoride release layer which had been first deposited onto the polyester substrate. In this second coating area, the rate of evaporation of the titanium dioxide was controlled at a deposition rate to provide a layer of titanium dioxide having a geometric thickness of 509 Å.

After the vapor deposition operations were complete, the roll of coated polyester was removed from the vacuum chamber and washed with water to remove the titanium dioxide pigment. The resulting pigment was collected by filtration, washed with distilled water to remove sodium fluoride and dried. In washing, final wash should have a conductivity of about 70 micromhos or less indicating that substantially all of the sodium fluoride has been removed. The dry titanium dioxide pigment was then calcined in air at temprature of from about 500° C. to 700° C. for about 1 to 4 hours.

The calcined titanium dioxide pigment was reduced in size by sonification and classified by elutriating in distilled water. The resulting slurry contained lamellar titanium dioxide pigment flakes with a particle size (major dimension) between about 3 and about 7 microns.

The lamellar titanium dioxide pigment of EXAMPLE I exhibited higher specular reflectivity than lamellar pigment prepared under similar conditions but utilizing a sodium chloride release layer. The lamellar titanium dioxide pigment produced by the process of the invention was shown by scanning electron microscopy to exhibit a flatter and more uniform surface texture than pigment prepared by a similar method utilizing a sodium chloride release layer.

EXAMPLE II

This EXAMPLE illustrates a method for the production of individual, single-layer lamellar zirconium dioxide pigment.

The apparatus and procedures described in EXAMPLE I was utilized except as indicated herein. In the first coating area, a release layer of sodium fluoride was applied as a layer of approximately 575 Å geometric thickness. In the second coating area, zirconium dioxide was evaporated and deposited onto the sodium fluoride release layer at a geometric thickness of 600 Å.

After the vapor deposition operations were complete, the roll of coated polyester was removed from the vacuum chamber and washed with water to remove the zirconium dioxide pigment. The pigment was collected by filtration, washed with distilled water to remove sodium fluoride and dried. The dry zirconium dioxide pigment was then calcined in air at temperatures ranging between about 400° to about 900° C. for 1 to 4 hours.

The calcined zirconium dioxide pigment was reduced in size by sonification and classified by elutriating in distilled water. The resultant slurry contained lamellar zirconium dioxide flakes with a particle size (major dimension) between about 1 to about 12 microns.

EXAMPLE III

A web of polyester substrate material (4 mil Mylar of 10 inch width), on a supply roll in communication with a take-up roll, was enclosed within a vacuum chamber comprised of two separate coating area. The coating areas were separated by a vertical nickel-plated iron plate and each such coating area was equipped with (1) a hearth comprised of a block having a plurality of recessed cavities, each of approximately 30 cc. volume and designed to accomodate a substance to be deposited onto the polyester web, and (2) an electron beam gun for the provision of a source of energy (270° bent beam) for the vaporization of the substance to be deposited. Each hearth was adapted to rotation so as to position in predetermined manner any such cavity within the path of the electron beam. In each coating area, rate of deposition was monitored and controlled with the aid of quartz crystal sensor heads and digital deposition controllers and was adjusted to steady state prior to the opening of a shutter placed over each hearth. The supply and take-up of the polyester web was conducted such that the web was passed over each hearth at a distance of approximately 16 inches. In the first coating area, the multiple-cavity hearth was supplied with separate charges of titanium dioxide, sodium fluoride and magnesium fluoride (hearth #1). The multiple-cavity hearth in the second coating area was supplied with separate charges of magnesium fluoride and titanium dioxide (hearth #2). The vacuum chamber was sealed and evacuated and pressure was maintained between about $5 \times 10^{-6}$ and $5 \times 10^{-5}$ mm of mercury during the vapor deposition operations.

A release layer of sodium fluoride was deposited upon the polyester web from the first coating area by passage of the web from the supply roll to the take-up roll in communication therewith. The rate of deposition of sodium fluoride was controlled by the rate of evaporation and the speed of the moving web (approximately 12 feet per minute) so as deposit a release layer of approximately 200 Å thickness. A layer of titanium dioxide was evaporated and deposited onto the sodium fluoride release layer by passage of the web through the second coating area. In this second coating area, a layer of titanium dioxide of approximately 509 Å thickness was deposited. Upon completion of the passage of the polyester web through the first and second coating areas, the materials were cooled for thirty minutes before rotating the hearths for a return run of the web in the opposite direction. During the return run of the web, a layer of magnesium fluoride of approximately 996 Å thickness was deposited onto the aforesaid titanium dioxide layer and the run was continued so as to deposit a layer of titanium dioxide (of approximately 507 Å thickness) onto the magnesium fluoride layer. Utilizing this procedure the following layers were, thus, deposited, onto the polyester web from the indicated hearth and coating areas:

| Layer | Hearth |
|---|---|
| Sodium Fluoride (200 Å) | Hearth #1 |
| Titanium Dioxide (509 Å) | Hearth #2 |
| Magnesium Fluoride (996 Å) | Hearth #2 |
| Titanium Dioxide (509 Å) | Hearth #1 |

The polyester web having deposited thereon the multi-layer lamellar pigment prepared as described was removed from the vacuum chamber and washed with distilled water for dissolution of the sodium fluoride release layer and separation of the multi-layer lamellar pigment material. The resulting dispersion of pigment material was filtered and washed free of sodium fluoride. The pigment material was rinsed with acetone to remove excess water and was dried overnight under vacuum. The dried material was calcined in air, reduced in size by sonification technique and classified by elutriation in distilled water.

EXAMPLE IV

This EXAMPLE describes the preparation of a multi-layer lamellar pigment comprised of five layers (three layers of titanium dioxide and two layers of magnesium fluoride, each layer of magnesium fluoride being sandwiched between titanium dioxide layers.

The apparatus and procedure set forth in EXAMPLE III were utilized except that the polyester web was run in one direction past the first and second coating areas, through a return run in reverse direction and for a final run in the initial direction so as to deposit the following layers in the indicated hearth and coating areas:

| Layer | Hearth |
|---|---|
| Sodium Fluoride (200 Å) | 1 |
| Titanium Dioxide (507 Å) | 2 |
| Magnesium Fluoride (979 Å) | 2 |
| Titanium Dioxide (507 Å) | 1 |
| Magnesium Fluoride (979 Å) | 1 |
| Titanium Dioxide (507 Å) | 2 |

EXAMPLE V

This EXAMPLE describes the preparation of a multi-layer lamellar pigment comprised of two titanium dioxide layers and a layer of strontium fluoride therebetween. The apparatus and procedure set forth in EXAMPLE III was utilized except that the hearths were charged with sodium fluoride and titanium dioxide (hearth #1) and titanium dioxide and strontium fluoride (hearth #2) for deposition of the following layers on the polyester web from the indicated hearth and coating areas:

| Layer | Hearth |
|---|---|
| Sodium Fluoride (200 Å) | 1 |
| Titanium Dioxide (507 Å) | 2 |
| Strontium Fluoride (965 Å) | 2 |
| Titanium Dioxide (507 Å) | 1 |

EXAMPLE VI

This EXAMPLE describes the preparation of a multi-layer lamellar pigment comprised of two titanium dioxide layers and a layer of magnesium fluoride therebetween. The apparatus and procedure set forth in EXAMPLE III was utilized except that the hearths were charged with sodium fluoride and titanium dioxide (hearth #1) and titanium dioxide and magnesium fluoride (hearth #2) for deposition of the following layers on the polyester web from the indicated hearth and coating areas:

| Layer | Hearth |
|---|---|
| Sodium Fluoride (200 Å) | 1 |
| Titanium Dioxide (463 Å) | 2 |
| Magnesium Fluoride (996 Å) | 2 |
| Titanium Dioxide (463 Å) | 1 |

The conduct of the vacuum deposition method of the invention as set forth in the Examples hereof, was effected with minimal cavitation or "tunneling" of the sodium fluoride charge. Satisfactory control of the rate of deposition of the sodium fluoride and uniform deposition permitting ready removal of the pigment material from the depositing surface were realized. These advantages are of special significance in relation to the cavitation and rate control characteristics and difficulty in pigment removal observed in the case of the utilization of sodium chloride as a release-substrate material. Improved rate control and uniform deposition are believed attributable, at least in part, to the lower heat sensitivity of sodium fluoride as compared to sodium chloride and to the higher melting point of sodium fluoride (988° C. vs. 801° C.). In addition, the higher density of sodium fluoride (2.55 vs. 2.16 g./cc.) allowed a fixed volume hearth of 30 cc. capacity to accomodate an additional 12 grams of charge material, thus, extending the useful life of the charge material for longer runs.

Since certain changes may be made in the above process without departing from the scope of the invention herein involved, it is intended that all matter contained in the above description shall be interpreted as illustrative and not in a limiting sense.

What is claimed is:

1. In a method for preparing a lamellar pigment material comprising the steps of first depositing onto a surface under vacuum a thin layer of a release-substrate material; thereafter, depositing under vacuum onto said layer of release-substrate material at least one layer of a lamellar pigment-producing material; dissolving said release-substrate material in a liquid which is a solvent for said release-substrate material and a non-solvent for said lamellar pigment material, thereby to remove said lamellar pigment material from said surface; and fragmenting said lamellar pigment material to lamellar pigment particles; the improvement which comprises utilizing sodium fluoride as said release-substrate material.

2. The method of claim 1 wherein said sodium fluoride release-substrate material and said lamellar pigment-producing material are deposited onto said surface from within a single vacuum chamber.

3. The method of claim 2 wherein said surface is a moving belt having a smooth surface.

4. The method of claim 3 wherein said moving belt comprises a polyester web.

5. The method of claim 3 wherein said sodium fluoride and said lamellar pigment-producing materials are deposited in a plurality of alternating layers.

6. The method of claim 1 wherein said lamellar pigment material is removed from said surface by dissolving said sodium fluoride release-substrate material in water.

7. The method of claim 1 wherein said lamellar pigment-producing material is deposited onto said sodium fluoride release-substrate material as a layer having a thickness within the expression:

$$T = (\lambda/4)/n$$

(or an odd multiple thereof) wherein T is the geometric thickness thereof, $\lambda$ represents a wavelength in the visible region of the spectrum and n represents the index of refraction of the layer material.

8. The method of claim 7 wherein said index of refraction is at least 1.7.

9. The method of claim 8 wherein said index of refraction is in the range of from about 2.0 to about 2.8.

10. The method of claim 8 wherein $\lambda$ represents a wavelength or wavelength range of radiation between about 5000 Å to about 5500 Å.

11. A method of claim 1 wherein said lamellar pigment-providing material comprises titanium dioxide.

12. The method of claim 1 wherein said lamellar pigment-providing material comprises zirconium dioxide.

13. The method of claim 1 wherein a plurality of layers of lamellar pigment-producing materials is deposited onto said sodium fluoride release-substrate material.

14. The method of claim 13 wherein said plurality of layers comprises an odd number of layers and said layers comprise layers of high index material having an index of refraction of at least 1.7 separated by an adjacent layer having an index of refraction of about 1.5 or lower.

15. The method of claim 14 wherein each of said plurality of layers has a thickness within the expression:

$$T = (\lambda/4)/n$$

(or an odd multiple thereof) wherein T is the geometric thickness thereof, $\lambda$ represents a wavelength in the visible region of the spectrum and n represents the index of refraction of the layer.

16. The method of claim 15 wherein the refractive index of each of said layers of high refractive index is from about 2.0 to about 2.8.

17. The method of claim 16 wherein $\lambda$ represents a wavelength or wavelength range of radiation between about 5000 Å and about 5500 Å.

18. The method of claim 15 wherein said odd number of layers comprises three layers and each of said layers of high refractive index comprises titanium dioxide.

19. The method of claim 15 wherein said odd number of layers comprises five layers and each of said layers of high refractive index comprises titanium dioxide.

* * * * *